(12) United States Patent
Olson

(10) Patent No.: US 9,391,566 B2
(45) Date of Patent: Jul. 12, 2016

(54) METHODS AND DEVICES FOR TESTING SEGMENTED ELECTRONIC ASSEMBLIES

(71) Applicant: Peregrine Semiconductor Corporation, San Diego, CA (US)

(72) Inventor: Chris Olson, Palatine, IL (US)

(73) Assignee: Peregrine Semiconductor Corporation, San Diego, CA (US)

(*) Notice: Subject to any disclaimer, the term of this patent is extended or adjusted under 35 U.S.C. 154(b) by 300 days.

(21) Appl. No.: 14/081,678

(22) Filed: Nov. 15, 2013

(65) Prior Publication Data
US 2015/0137845 A1    May 21, 2015

(51) Int. Cl.
| | |
|---|---|
| *G01R 31/20* | (2006.01) |
| *H03F 1/56* | (2006.01) |
| *H03F 3/19* | (2006.01) |
| *H03F 3/21* | (2006.01) |
| *G01R 31/28* | (2006.01) |
| *G01R 27/16* | (2006.01) |
| *H03F 3/72* | (2006.01) |

(52) U.S. Cl.
CPC *H03F 1/56* (2013.01); *G01R 27/16* (2013.01); *G01R 31/282* (2013.01); *H03F 3/19* (2013.01); *H03F 3/211* (2013.01); *H03F 3/72* (2013.01); *H03F 2200/387* (2013.01); *H03F 2200/451* (2013.01); *H03F 2203/7236* (2013.01)

(58) Field of Classification Search
CPC ............... H03F 2200/387; H03F 2200/451; H03F 2203/7236; H03F 3/19; H03F 3/211; H03F 3/72; H03F 1/56; G01R 31/282; G01R 27/16

USPC ..................................................... 324/754.03
See application file for complete search history.

(56) References Cited

U.S. PATENT DOCUMENTS

| | | | | |
|---|---|---|---|---|
| 6,137,355 A | * | 10/2000 | Sevic ..................... | H03F 1/0216 330/124 R |
| 6,255,906 B1 | * | 7/2001 | Eidson ................... | H03F 1/0277 330/124 R |
| 6,377,117 B2 | * | 4/2002 | Oskowsky ............. | H03F 1/0277 330/51 |
| 6,586,996 B2 | * | 7/2003 | Fanous .................. | H03F 3/45183 330/254 |

(Continued)

FOREIGN PATENT DOCUMENTS

WO    2009108391    9/2009

OTHER PUBLICATIONS

Olson, Chris, Response filed in the USPTO dated Jul. 7, 2015 for U.S. Appl. No. 14/081,856, 12 pgs.

(Continued)

*Primary Examiner* — Jermele M Hollington
*Assistant Examiner* — Sean Curtis
(74) *Attorney, Agent, or Firm* — Jaquez Land Greenhaus LLP; Martin J. Jaquez; Alessandro Steinfl, Esq.

(57) ABSTRACT

Methods and devices are disclosed for testing an electronic assembly comprising a number of segments. In one embodiment, a scalable periphery amplifier may comprise a number of amplifier segments. In one embodiment a method of testing the amplifier segments in a scalable periphery architecture is described. One or more of the amplifier segments can be independently turned on and/or turned off to achieve desired impedance characteristics of the overall amplifier to test the scalable periphery amplifier. In another embodiment, the electronic assembly comprises digitally tunable capacitors.

29 Claims, 4 Drawing Sheets

(56) References Cited

U.S. PATENT DOCUMENTS

| | | | |
|---|---|---|---|
| 7,088,971 B2 | 8/2006 | Burgener et al. | |
| 7,170,341 B2 * | 1/2007 | Conrad | H03F 1/02 330/296 |
| 7,248,120 B2 | 7/2007 | Burgener et al. | |
| 7,313,416 B1 * | 12/2007 | Harmon | H04B 1/0483 330/133 |
| 7,332,969 B2 * | 2/2008 | Woong | H03F 1/30 330/207 P |
| 8,131,251 B2 | 3/2012 | Burgener et al. | |
| 8,138,829 B2 * | 3/2012 | Reddy | H03F 1/0277 330/124 R |
| 8,150,343 B2 * | 4/2012 | Ramachandra Reddy | H03F 1/0227 455/107 |
| 8,188,788 B2 * | 5/2012 | Lee | H03F 3/211 330/195 |
| 8,350,625 B2 * | 1/2013 | Komijani | H03F 1/223 330/276 |
| 8,502,598 B2 * | 8/2013 | Seddighrad | H03F 1/0277 330/124 R |
| 8,559,907 B2 | 10/2013 | Burgener et al. | |
| 8,649,754 B2 | 2/2014 | Burgener et al. | |
| 9,007,125 B2 * | 4/2015 | Correa | H03F 3/211 330/66 |
| 9,093,731 B2 * | 7/2015 | Correa | H01P 5/12 |
| 9,160,292 B2 * | 10/2015 | Olson | H03F 3/68 |
| 9,184,702 B2 * | 11/2015 | Kovac | H03F 1/0222 |
| 2005/0030094 A1 * | 2/2005 | Conrad | H03F 1/02 330/144 |
| 2010/0240332 A1 * | 9/2010 | Nagayama | H03F 1/0294 455/127.1 |
| 2013/0082772 A1 * | 4/2013 | Seddighrad | H03F 1/0277 330/124 R |
| 2014/0177755 A1 * | 6/2014 | Lu | H03F 1/3241 375/297 |
| 2014/0266433 A1 * | 9/2014 | Nobbe | H03F 1/30 330/151 |
| 2014/0266460 A1 * | 9/2014 | Nobbe | H03F 1/0261 330/295 |
| 2015/0028953 A1 * | 1/2015 | Kovac | H03F 1/0261 330/255 |
| 2015/0042406 A1 * | 2/2015 | Kovac | H03F 1/0222 330/297 |
| 2015/0091656 A1 * | 4/2015 | Gaynor | H03H 11/28 330/302 |
| 2015/0091657 A1 * | 4/2015 | Gaynor | H03F 3/21 330/302 |
| 2015/0137845 A1 * | 5/2015 | Olson | H03F 1/56 324/754.03 |
| 2015/0137889 A1 * | 5/2015 | Olson | H03F 1/56 330/295 |
| 2015/0137890 A1 * | 5/2015 | Nobbe | H03F 1/0277 330/295 |

OTHER PUBLICATIONS

Nobbe, Dan, Response filed in the USPTO dated Jul. 7, 2015 for U.S. Appl. No. 14/082,004, 12pgs.

Olson, Chris, Response After Final Office Action filed in the USPTO dated Nov. 30, 2015 for U.S. Appl. No. 14/081,856, 7 pgs.

Nobbe, Dan, Response to Final Office Action filed in the USPTO dated Nov. 30, 2015 for U.S. Appl. No. 14/082,004, 9 pgs.

Nguyen, Khanh V., Office Action received from the USPTO dated Apr. 10, 2015 for U.S. Appl. No. 14/081,856, 14 pgs.

Nguyen, Khanh V., Office Action received from the USPTO dated Apr. 10, 2015 for U.S. Appl. No. 14/082,004, 15 pgs.

Nguyen, Khanh V., Final Office Action received from the USPTO dated Oct. 8, 2015 for U.S. Appl. No. 14/081,856, 16 pgs.

Nguyen, Khanh V., Final Office Action received from the USPTO dated Oct. 8, 2015 for U.S. Appl. No. 14/082,004, 9 pgs.

Nguyen, Khanh V., Notice of Allowance received from the USPTO dated Dec. 18, 2015 for U.S. Appl. No. 14/081,856, 5 pgs.

Nguyen, Khanh V., Notice of Allowance received from the USPTO dated Jan. 11, 2016 for U.S. Appl. No. 14/082,004, 7 pgs.

Nguyen, Khanh V., Notice of Allowance received from the USPTO dated Mar. 22, 2016 for U.S. Appl. No. 14/082,004, 12 pgs.

Nguyen, Khanh V., Notice of Allowance received from the USPTO dated Apr. 18, 2016 for U.S. Appl. No. 14/081,856, 12 pgs.

* cited by examiner

METHODS AND DEVICES FOR TESTING SEGMENTED ELECTRONIC ASSEMBLIES

CROSS REFERENCE TO RELATED APPLICATIONS

The present application may be related to U.S. patent application Ser. No. 13/797,779 entitled "Scalable Periphery Tunable Matching Power Amplifier", filed on Mar. 12, 2013, whose disclosure is incorporated herein by reference in its entirety. The present application may also be related to International Application No. PCT/US2009/001358, entitled "Method and Apparatus for use in digitally tuning a capacitor in an integrated circuit device", filed on Mar. 2, 2009, the disclosure of which is incorporated herein by reference in its entirety. The present application may also be related to U.S. Pat. No. 7,248,120, issued on Jul. 24, 2007, entitled "Stacked Transistor Method and Apparatus", the disclosure of which is incorporated herein by reference in its entirety.

The present application may also be related to U.S. application Ser. No. 14/081,856 entitled "Devices and Methods for Increasing Life of Scalable Periphery Amplifiers" filed on even date herewith and incorporated herein by reference in its entirety. The present application may also be related to U.S. application Ser. No. 14/082,004 entitled "Devices and Methods for Improving Yield of Scalable Periphery Amplifiers" filed on even date herewith and incorporated herein by reference in its entirety.

SUMMARY

According to a first aspect, a method of testing a circuital arrangement is provided, the method comprising: providing an electronic assembly on a die, the electronic assembly comprising a plurality of electronic assembly segments, each electronic assembly segment having an input and an output, and the plurality of electronic assembly segments having an overall output impedance; connecting a testing device external to the die to the electronic assembly such that, when testing, a test signal is adapted to pass through the electronic assembly; configuring at least one of the electronic assembly segments in such a way as to be able to activate or deactivate the at least one of the electronic assembly segments; deactivating one or more electronic assembly segments of the plurality of electronic assembly segments, while leaving the remaining assembly segments activated, thus increasing the overall output impedance of the electronic assembly; and applying the test signal from the testing device to the electronic assembly, thus testing the one or more electronic assembly segments which are activated.

According to second aspect, an amplifier is provided, the amplifier comprising: a scalable periphery amplifier comprising one or more amplifier segments connected in parallel with each other and configured to be selectively activated or deactivated; a circuital arrangement operatively coupled to the scalable periphery amplifier, wherein the circuital arrangement is configured to select during operation of the amplifier a mode of operation of the scalable periphery amplifier between a non-test mode and a test mode of operation.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Figure 1:
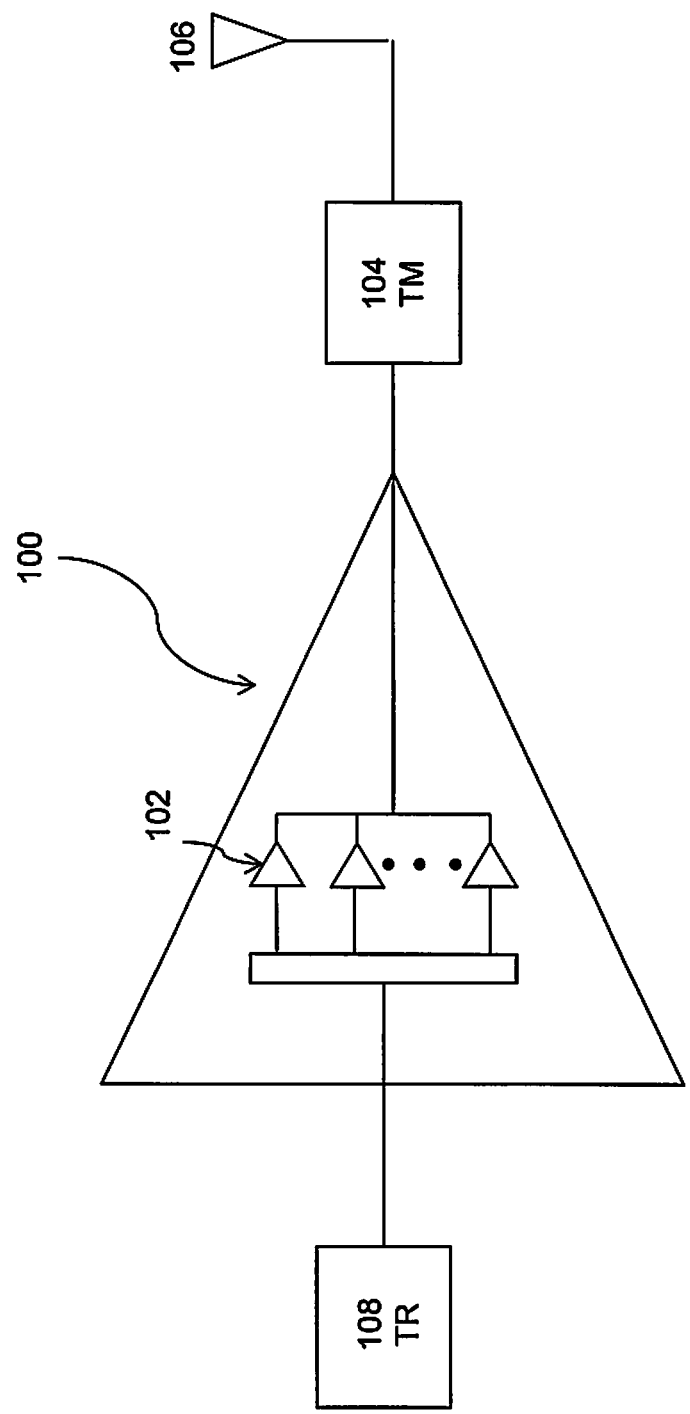
FIG. 1 shows an overview of a segmented electronics assembly consisting of an amplifier arrangement connected with a transmitter, a matching network and an antenna.

Integrated circuit designs are implemented with ever refining techniques and architectures. In some of these architectures, an electronic circuit comprises an assembly of parts, which can be denoted as segments. The purpose of such an implementation using segments can be varied. For example, digitally tunable capacitors are referred to, for example, in International Application No. PCT/US2009/001358, entitled "Method and Apparatus for use in digitally tuning a capacitor in an integrated circuit device", filed on Mar. 2, 2009, the disclosure of which is incorporated herein by reference in its entirety. Such capacitors comprise a number of segments. Another example (U.S. Ser. No. 13/797,779) discloses power amplifiers comprising a number of amplifier segments. These examples are not meant as a limitation of the present disclosure, but serve to exemplify what is intended as an electronic assembly comprising a number of assembly segments. The present disclosure relates to methods for testing such electronic assemblies.

As used in the present disclosure, the terms "switch ON" and "activate" may be used interchangeably and can refer to making a particular circuit element electronically operational. As used in the present disclosure, the terms "switch OFF" and "deactivate" may be used interchangeably and can refer to making a particular circuit element electronically non-operational. As used in the present disclosure, the terms "amplifier" and "power amplifier" may be used interchangeably and can refer to a device that is configured to amplify a signal input to the device to produce an output signal of greater magnitude than the magnitude of the input signal.

The present disclosure describes electrical circuits in electronics devices (e.g., cell phones, radios) having a plurality of devices, such as for example, transistors (e.g., MOSFETs). Persons skilled in the art will, appreciate that such electrical circuits comprising transistors can be arranged as amplifiers. As described in a previous disclosure (U.S. Ser. No. 13/797, 779), a plurality of such amplifiers can be arranged in a so-called "scalable periphery" (SP) architecture of amplifiers where a total number (e.g., 64) of amplifier segments are provided. Depending on the specific requirements of an application, the number of active devices (e.g., 64, 32, etc.), or a portion of the total number of amplifiers (e.g. 1/64, 2/64, 40% of 64, etc. . . . ), can be changed for each application. For example, in some instances, the electronic device may desire to output a certain amount of power, which in turn, may require 32 of 64 SP amplifier segments to be used. In yet another application of the electronic device, a lower amount of output power may be desired, in which case, for example, only 16 of 64 SP amplifier segments are used. In other words, in a given first time period, a first number of devices can be used, while in a subsequent time period, a different number of devices can be used based on desired output power. According to some embodiments, the number of amplifier segments used can be inferred by a nominal desired output power as a function of the maximum output power (e.g. when all the segments are activated). For example, if 30% of the maximum output power is desired, then a portion of the total amplifier segments corresponding to 30% of the total number of segments can be enabled.

The term "amplifier" as used herein the present disclosure is intended to refer to amplifiers comprising single or stacked transistors configured as amplifiers, and can be used interchangeably with the term "power amplifier (PA)". Stacked transistor amplifiers are described for example in U.S. Pat. No. 7,248,120, issued on Jul. 24, 2007, entitled "Stacked Transistor Method and Apparatus", the disclosure of which is incorporated herein by reference in its entirety. Such amplifier and power amplifiers can be applicable to amplifiers and power amplifiers of any stages (e.g., pre-driver, driver, final), known to those skilled in the art. The scalable periphery amplifier devices can be connected to corresponding impedance matching circuits. Such scalable periphery amplifier devices have a particular impedance value according to the number of amplifier segments that are turned on or turned off at a given moment, the modulation applied, the required output power, the linearity requirements of the amplifier or any number of other requirements.

As described above, an electronic circuit where all of the amplifiers of the scalable periphery architecture are turned on can be considered to be operating at full power, and such configuration can have a certain overall impedance based on the number of amplifiers that are turned on. In some instances, it can be desirable to turn off some amplifiers to operate the electronic circuit, for example, at reduced power consumption. Similar to measuring a total resistance of a plurality of resistors connected in parallel with each other, the total impedance of the plurality of amplifiers in a SP amplifier architecture can be calculated, simulated or measured in a similar manner. As known by those skilled in the art, the greater the number of amplifiers devices (in parallel), the lower the total impedance, and vice versa.

For determining the overall impedance of the plurality of amplifiers in an SP amplifier architecture, an amplifier that is off can be considered an open circuit (e.g., power amplifier device removed). Thus, if a certain number of amplifiers are turned off, then the total impedance of the SP amplifier will be higher. To the contrary, if the amplifier devices are on, then the total impedance of the amplifier circuit will be lower. As the amplifiers are turned on or turned off, the number of active amplifiers in the SP amplifier is decreased or increased, and therefore the overall impedance of the amplifier circuit is also changed.

An exemplary reason why it might be advantageous to take into account the overall impedance of an SP amplifier is for impedance matching with other electric or electronic components which are connected to the SP amplifier, such as, for example, tunable matching components, transceivers, antennas, other amplifiers, etc. As those skilled in the art will know, an impedance seen by the SP amplifier when connected to its output is generally termed a load impedance, and may include the impedance not only of the actual load (for example, an antenna), but also of any other component connected between the SP amplifier and the load (for example, a tunable matching component). The SP amplifier output impedance (or, alternatively, the impedance 'looking into' in the SP amplifier from its output terminal) and the load impedance (or, alternatively, the impedance seen by the SP amplifier at its output terminal) may be, in general, different. For different applications and requirements, certain values may be desirable for the impedance of the SP amplifier and the load impedance. For example, as it is known by those skilled in the art, for obtaining maximum gain the load impedance and the output amplifier impedance may be complex conjugates of one another. For other conditions (e.g., maximum power, maximum linearity, maximum efficiency) the load impedance and the amplifier output impedance may be different.

FIG. 1 shows a generic diagram of an example electronic circuit comprising an SP amplifier 100, which in turn, is comprised of a scalable periphery architecture 102 of amplifiers. An electronic circuit 108 can be connected to an input of the amplifier 100. In one embodiment, the electronic circuit may be a transmitter 108. The transmitter may be part of a transceiver. An output of the amplifier can be connected to a matching circuit 104, which can then be connected to an antenna 106. In this embodiment the antenna 106 would be a load, and a tunable matching component 104 is connected between the SP amplifier 100 and the antenna 106. The load impedance seen by the SP amplifier at its output is the sum of the impedance of the antenna 106 plus the impedance of the tunable matching circuit 104. A person skilled in the art will understand that the diagram shown in FIG. 1 is generic and that the electronic circuit can comprise more or less component such as, for example, a plurality of amplifiers (e.g., pre-driver stage, driver stage) or an antenna switch, which are not shown.

Figure 2:
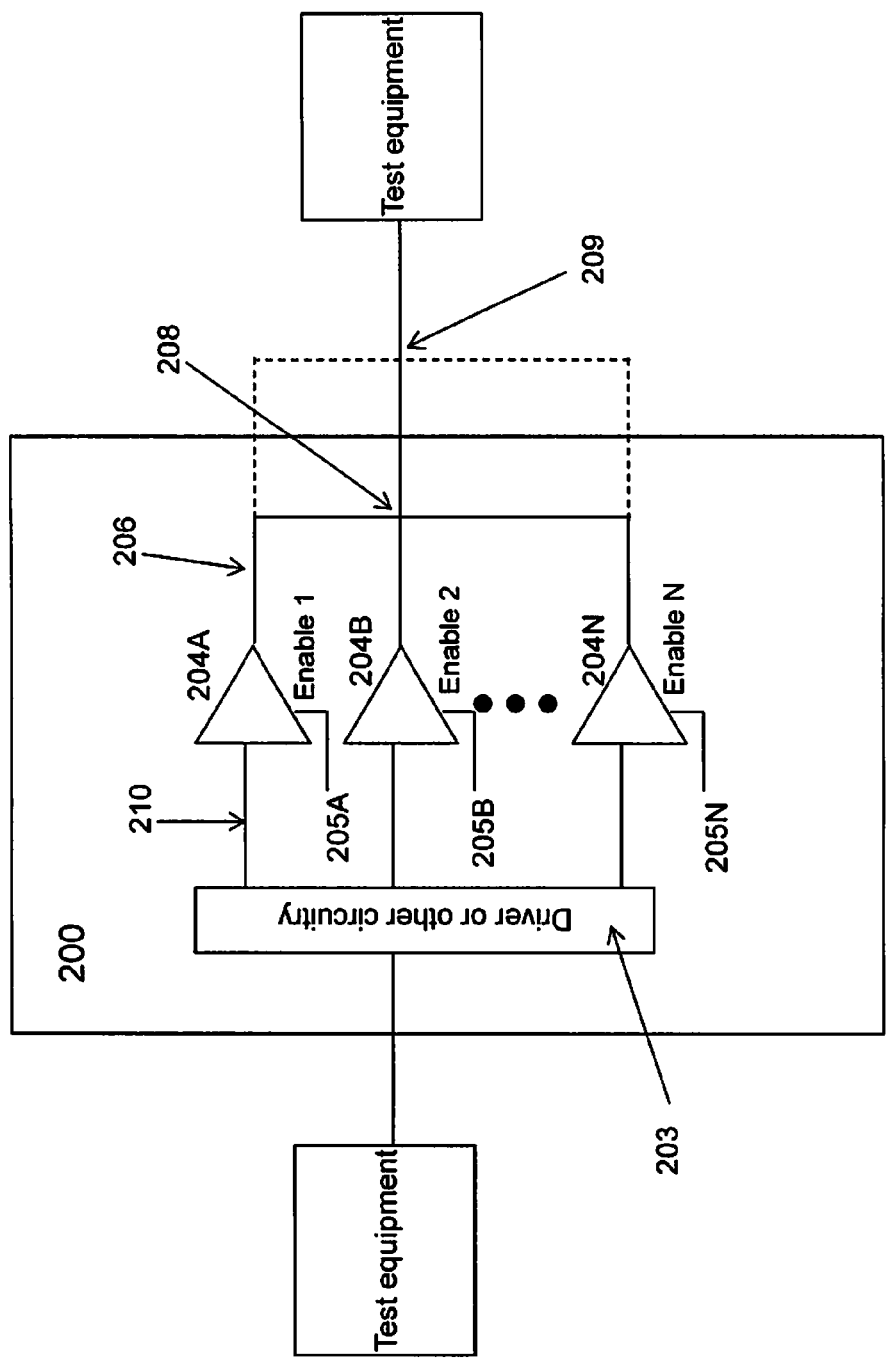
FIG. 2 shows an example electronic assembly on a die comprising a plurality of amplifier segments connected with external test equipment.

According to some embodiments, amplifier segments can be part of an SP amplifier as shown in FIG. 2. FIG. 2 shows a die 200 (on wafer) comprising a plurality of amplifier segments 204A, 204B . . . 204N electrically connected in parallel with one another. Each of the amplifier segments 204A, 204B . . . 204N can be turned on or turned off independently of one another by a logic controller (shown later in FIGS. 4A-4B) that is connected to each of the enable inputs 205A, 205B . . . 205N on the amplifier segments. For example, the logic controller can send an independent disable signal to the enable input 205A in order to turn off amplifier segment 204A, and send an independent enable signal to the enable inputs 205B . . . 205N in order to turn on (or leave on) amplifier segments 204B . . . 204N. Such enable and/or disable signals can be independent of one another, such that the enable and/or disable signal applied to an enable input of a one amplifier segment is unrelated and/or unaffected by the enable and/or disable signal applied to the enable input of another amplifier segment. Since the amplifier segments 204A, 204B . . . 204N are connected in parallel with one another, as described above, similar to a plurality of resistors that are connected in parallel, the overall output impedance of the amplifier segments 204A, 204B . . . 204N is reduced as the number of active amplifier segments increase. On the other hand, the overall impedance of the amplifier segments increase as the number of amplifier segments 204A, 204B . . . 204N connected in parallel decrease. When the number of active amplifier segments is varied to optimize a desired parameter of the SP amplifier (as described in detail in the previous disclosure U.S. Ser. No. 13/797,779), the impedance of the SP amplifier may decrease or increase.

The change in impedance in an SP amplifier can be exploited for testing its functionality with an RF membrane probe. As it is known by those skilled in the art, it may be desirable, in some cases, to test amplifiers, for example, to verify reliability, functionality or to ensure that the amplifier segments meet required specifications. Such testing may be carried out through an RF membrane probe. However, as the power at which an amplifier is designed to operate increases (in which case, an amplifier may be generally termed as a "high power" amplifier), it may be difficult to test it with an RF membrane probe. One reason is that the SP amplifier might have a low impedance and operate at a high dc current, but the RF probe is lossy. As it is known by those skilled in the art, RF loss (attenuation) and DC resistance in an RF membrane probe when connected to an amplifier may be problematic. For example, if the RF probe has a higher resistance than the amplifier it may be difficult to accurately measure the amplifier's resistance. If it were possible to increase the resistance of the amplifier, for example making it higher than the RF probe resistance, then it would be easier to accurately measure the amplifier's resistance. With an SP amplifier, said RF testing may be carried out by turning off all but one amplifier segment, thus increasing the impedance of the SF amplifier. Further, with such high impedance the current between the RF probe and the SP amplifier is reduced. A possible advantage is then a reduced requirement in the current that needs to be provided to the SP amplifier for testing. The test results are less sensitive to the RF loss (attenuation) and DC resistance of the RF membrane probe. All segments can then be tested serially by activating one segment at a time, sequentially.

Figure 3:
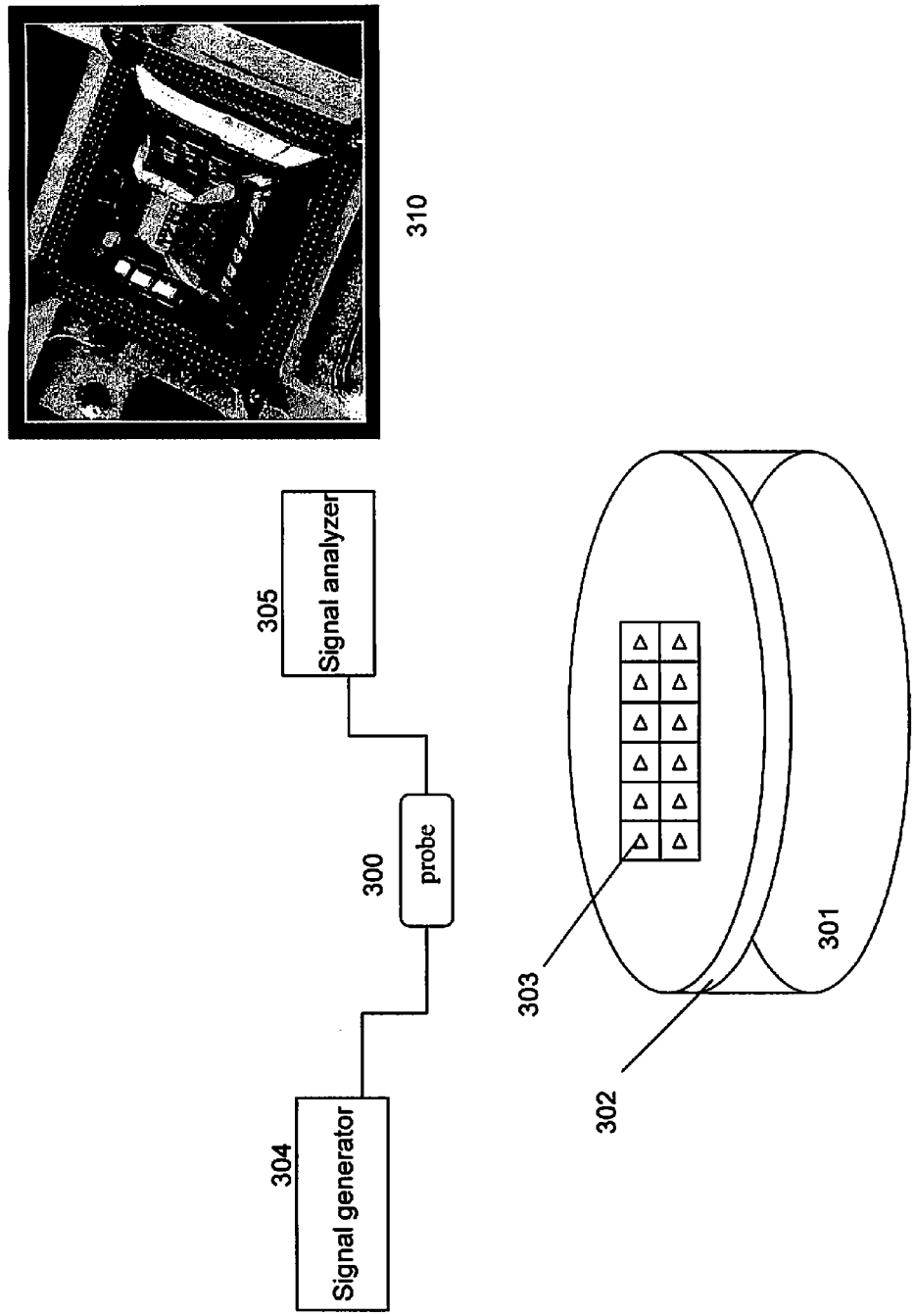
FIG. 3 shows an example setup for testing a plurality of electronic arrangements on a wafer with a probe.

An example of RF testing is shown in FIG. 3. By way of example and not of limitation, during production of the plurality of amplifier segments, a wafer 302 comprising the plurality of plurality of amplifier segments 303 can be placed on a movable platform (e.g., chuck or wafer prober) 301. A testing tool such as an RF probe tester 300 can be used to contact specific sections on the wafer (e.g., test points on the die at the output of the amplifier segments 303). Test equipment such as a signal generator 304 and a signal analyzer 305, such as a spectrum analyzer, can be connected with the RF probe tester 300 to measure, for example, gain, efficiency, linearity, and/or power. In one embodiment, the RF probe tester 300 may be stationary, and the movable platform 301 can be moved horizontally and vertically in order to bring specific test points of the wafer 302 into contact with the RF probe tester 300. In FIG. 3 an exemplary image of an RF membrane probe 310 is depicted.

As known by those skilled in the art, in order to ease the measurement of the amplifier segments, the overall impedance of the amplifier segments should match the impedance of the test equipment. As described earlier, if all (or most) of the amplifier segments are turned on (enabled), then the overall impedance of the amplifier segments is lower than the overall impedance of the amplifier segments if some of the amplifier segments are disabled. In some instances, a test equipment can have an impedance of 50 ohms. On the other hand, in the example SP amplifier, if all of the amplifier segments are turned on (enabled), the overall impedance of the amplifier segments may be substantially lower, such as 2 ohms. A person skilled in the art would understand that the greater the number of amplifier segments that are turned on, the greater the output power of the amplifier, as well as the DC current used to power the amplifiers. Such large output power and/or large current can stress the RF probe tester, which in turn, can reduce the life of the RF probe tester.

Referring back to FIG. 3, an impedance matching network can be implemented between the RF probe tester 300 and the signal analyzer 305 to match the impedance of the RF probe tester 300 and that of the signal analyzer 305; an impedance matching network may also be implemented between the RF probe tester 300 and the amplifier segments 303. Such impedance matching networks can be optional or eliminated by changing the overall impedance of the amplifier segments 303 to an impedance value that is equivalent or similar to the impedance of the test equipment.

According to an embodiment of the present disclosure, the plurality of amplifier segments can be assembled on a die (e.g., silicon wafer). As shown in FIG. 2, each of the amplifier segments 204 on the die can have their own separate input 210 to the amplifier segment, and their own separate output 206 from the amplifier segment. In another embodiment, the inputs and outputs may also be shared. The separate inputs 210 can connect to a driver stage amplifier or other circuitry 203. The separate outputs 206 can be connected together, either on the die 200 or off the die, to form one common test point 208 (on the die) or 209 (off the die). In order to test the amplifier segments as described before, for example, during manufacturing of the amplifier segments, a testing device (e.g., RF probe tester) can be connected to the common test point (208 or 209) of the amplifier segments, and all but the one amplifier segment that is to be tested (e.g., amplifier segment 204A) can be independently turned off. By turning off all but the one amplifier segment that is to be tested, the overall impedance of the plurality of amplifier segments is increased. Once the one on amplifier segment 204A is tested, then the one on amplifier segment 204A can be turned off and the next amplifier segment to be tested (e.g., amplifier segment 204B) can be turned on. In other words, similar to the first amplifier segment that was tested (204A), all but the next amplifier to be tested (e.g., amplifier segment 204B) are turned off. Such process can be repeated for each of the plurality of amplifier segments 204A, 204B . . . 204N until all of the amplifier segments are tested.

Alternatively, the testing procedure is not necessarily limited to leaving on just one amplifier segment. For example, two amplifier segments 204A, 204B (or three, four, etc.) can be turned on, while the remaining amplifier segments 204C-204N are turned off. A person skilled in the art would understand that an SP amplifier where even just one amplifier segment is turned off can have an overall impedance value that is higher than the overall impedance value in an SP amplifier where all of the amplifier segments are turned on.

Figures 4A, 4B:
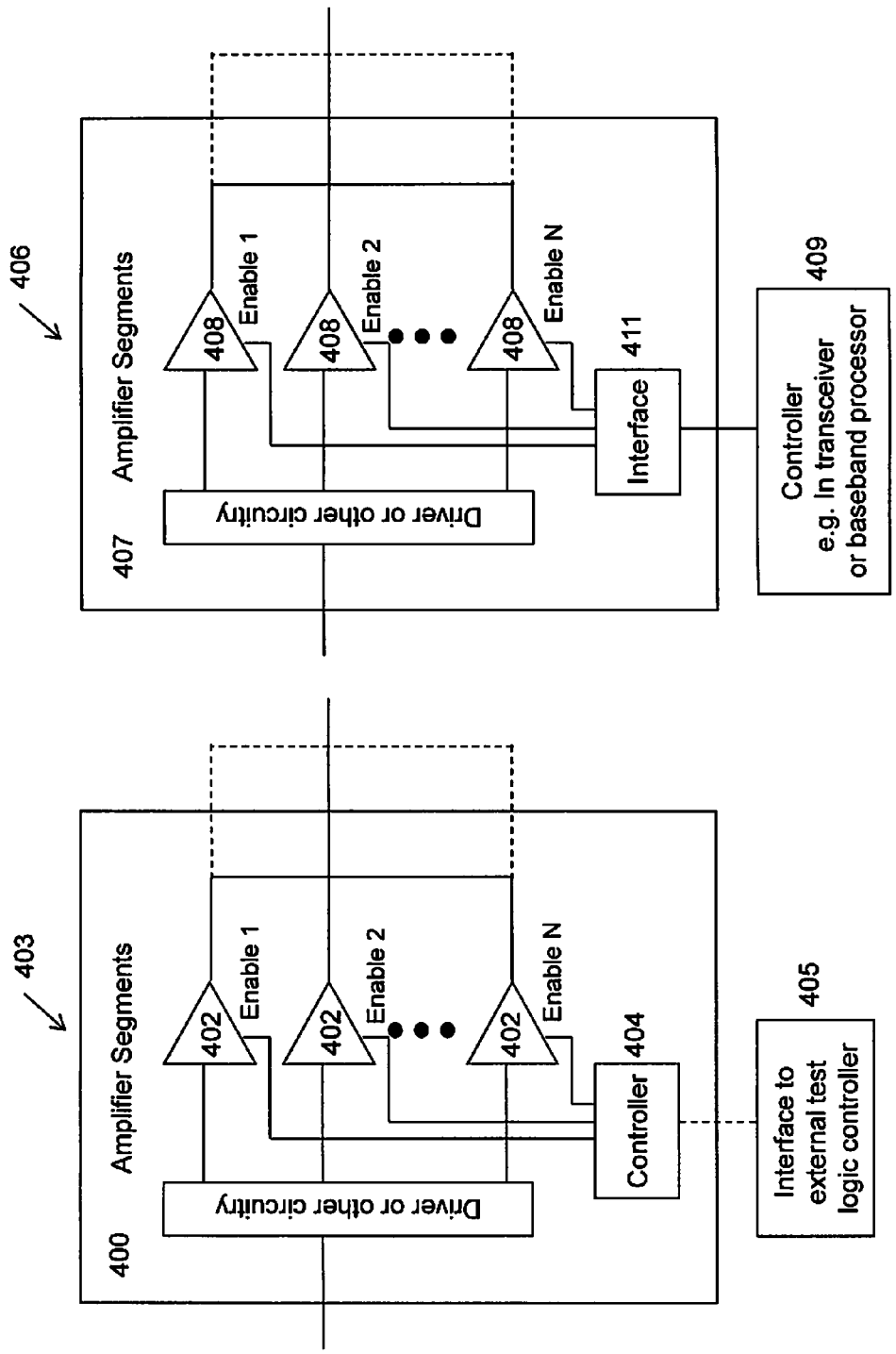
FIGS. 4A-4B show an amplifier with a controller located on and off a die.

In some embodiments, the SP amplifier can have a test mode and a non-test mode. In the non-test mode, the amplifier is configured such that when connected to appropriate power sources and provided with an appropriate input (e.g., an RF input signal), the amplifier will function as a scalable periphery (SP) amplifier. On the other hand, in the test mode, the SF amplifier can be configured for testing, for example, during manufacturing of the SP amplifier to ensure the SP amplifier is built in accordance with design specifications. FIG. 4A shows an SP amplifier 403 (alternatively denoted as simply an 'amplifier', as opposed to its 'amplifier segments'), said SP amplifier comprising a plurality of amplifier segments 402 on a die 400, with a logic controller 404 located on the die 400. In such configuration, an external testing logic controller 405 can be connected to the internal logic controller 404 in order for the amplifier 406 to perform test procedures by turning on and/or turning off the amplifier segments as described earlier according to various embodiments of the present disclosure. In such case, the controller 404 can detect connection to the external interface/controller 405 and automatically set the amplifier to the test mode. FIG. 4B shows an amplifier 406 similar to the amplifier 403 shown in FIG. 4A, also comprising a plurality of amplifier segments 408 on a die 407. Differently from the amplifier 403 in FIG. 4A, the amplifier 406 in FIG. 4B comprises a logic controller 409 located externally to the die 407, through an interlace 411. By way of example and not of limitation, such logic controller 409 can be located in a transceiver (similarly to 108 in FIG. 1) or in a baseband processor such that during operation of the amplifier 406, the control signals are provided from the transceiver or the baseband processor. On the other hand, when in the test mode, the external controller 409 can be provided, for example, by a test equipment to turn on and/or turn off the amplifier segments 408 to perform the test procedures according, for example, to the embodiment of FIG. 3. Similarly, the controller 409 in FIG. 4B may comprise different external logic controllers, depending on the mode of the amplifier (e.g., test mode or non-test mode).

The embodiments presented above relate to amplifiers, however any other electronic assembly which comprises a number of segments could be tested by the methods described herein. For example, segments of a digitally tunable capacitor may be tested with such methods. In one embodiment, the digitally tunable capacitor is configured in an assembly of segments in such a way that at least one of the segments can be tested independently of the other segments. As another example, a multi-throw RF switch comprising a number of independent unit segments larger than the number of throws of the multi-throw RF switch, each unit segment being, for example, a single-throw RF switch, can be considered for testing using the methods described in the present disclosure. In such exemplary case, each independent segment can be tested given the methods herein described and only a number of good segments being used for the final configuration (e.g. out of the factory) of the multi-throw RF switch.

The examples set forth above are provided to give those of ordinary skill in the art a complete disclosure and description of how to make and use the embodiments of the present disclosure, and are not intended to limit the scope of what the inventors regard as their disclosure. Modifications of the above described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

The invention claimed is:

1. A method of testing a circuital arrangement, the method comprising:
   a) providing an electronic assembly on a die, the electronic assembly comprising a plurality of electronic assembly segments, each electronic assembly segment having an input and an output, and the plurality of electronic assembly segments having an overall output impedance;
   b) connecting a testing device external to the die to the electronic assembly such that, when testing, a test signal is adapted to pass through the electronic assembly;
   c) configuring at least one of the electronic assembly segments in such a way as to be able to activate or deactivate the at least one of the electronic assembly segments;
   d) deactivating one or more electronic assembly segments of the plurality of electronic assembly segments, while leaving the remaining assembly segments activated, thus increasing the overall output impedance of the electronic assembly; and
   e) applying the test signal from the testing device to the electronic assembly, thus testing the one or more electronic assembly segments which are activated.

2. The method according to claim 1, further comprising repeating steps d)-e), each time activating different one or more electronic assembly segments of the plurality of electronic assembly segments, until all of the electronic assembly segments have been tested.

3. The method of claim 1, wherein each assembly segment can be activated or deactivated independently of the other assembly segments.

4. The method according to claim 1, wherein the electronic assembly is an amplifier and the electronic assembly segments are amplifier segments.

5. The method according to claim 4, wherein each amplifier segment of the amplifier is independently switchable between an ON condition and an OFF condition.

6. The method according to claim 5, wherein, during operation or testing of the circuital arrangement, number and portion of the amplifier segments in an ON condition is configurable.

7. The method according to claim 1, wherein the deactivation of the one or more electronic assembly segments comprises deactivating all but one electronic assembly segment, such that one electronic assembly segment is activated and the remaining electronic assembly segments are deactivated.

8. The method according to claim 1, wherein the overall output impedance of the electronic assembly with one or more electronic assembly segments deactivated is higher than the overall output impedance of the electronic assembly with all of the electronic assembly segments activated.

9. The method according to claim 1, wherein the connecting the testing device to the electronic assembly comprises connecting a first connection of the testing device to the input of the electronic assembly, and connecting a second connection of the testing device to the output of the electronic assembly.

10. The method according to claim 9, further comprising connecting a signal analyzer to the second connection of the testing device and analyzing the testing signal.

11. The method according to claim 10, wherein the signal analyzer is a spectrum analyzer.

12. The method according to claim 1, wherein the testing signal is a signal generated by a signal generator.

13. The method according to claim 1, wherein the testing device is an RF probe.

14. The method according to claim 1, wherein the testing is performed during production of the circuital arrangement.

15. An amplifier comprising:
   a scalable periphery amplifier comprising one or more amplifier segments connected in parallel with each other and configured to be selectively activated or deactivated, each of the one or more amplifier segments being configured to receive an external test signal for operation in a test mode;
   a circuital arrangement operatively coupled to the scalable periphery amplifier, wherein the circuital arrangement is configured to select during operation of the amplifier a mode of operation of the scalable periphery amplifier between a non-test mode and the test mode of operation, wherein, in the test mode, the circuital arrangement is configured to activate or deactivate a subset of the one or more amplifier segments for testing remaining activated amplifier segments via the external test signal.

16. The amplifier of claim 15, wherein the circuital arrangement further comprises a controller circuit configured during operation of the amplifier to control a configuration of the scalable periphery amplifier during operation in test mode.

17. The amplifier of claim 16, wherein the controller circuit is configured during operation of the amplifier to deactivate the subset of the one or more amplifier segments to control an output impedance of the scalable periphery amplifier.

18. The amplifier of claim 17, wherein the controller circuit further comprises an interface circuit to connect to an external test equipment, wherein the controller is further configured to detect connection of an external test equipment to the interface circuit.

19. The amplifier of claim 18, wherein the controller circuit is further configured during operation of the amplifier to automatically select the test mode of operation when connection to an external test equipment is detected.

20. A testing system for testing operation of the amplifier of claim 18 or claim 19, wherein the testing system comprises a controller circuital arrangement configured during testing of the amplifier to couple to the interface circuit of the amplifier such as to cause detection of the testing system by the controller unit of the amplifier.

21. The testing system of claim 20, wherein the controller circuital arrangement is further configured during testing of the amplifier to select the mode of operation of the scalable periphery amplifier.

22. The testing system of claim 21, wherein the controller circuital arrangement is further configured during testing of the amplifier to activate and/or deactivate the one or more amplifier segments such as to control an output impedance of the scalable periphery amplifier.

23. An amplifier comprising:
a scalable periphery amplifier comprising one or more amplifier segments connected in parallel with each other and configured to be selectively activated or deactivated;
a circuital arrangement operatively coupled to the scalable periphery amplifier, wherein the circuital arrangement is configured to select during operation of the amplifier a mode of operation of the scalable periphery amplifier between a non-test mode and a test mode of operation, the circuital arrangement comprising:
a controller unit comprising an interface circuit to connect to an external test equipment, wherein the controller unit is configured to:
detect connection of an external test equipment to the interface circuit,
control a configuration of the scalable periphery amplifier during operation in the test mode, and
activate and/or deactivate the one or more amplifier segments to control an output impedance of the scalable periphery amplifier.

24. An amplifier comprising:
a scalable periphery amplifier comprising one or more amplifier segments connected in parallel with each other and configured to be selectively activated or deactivated;
a circuital arrangement operatively coupled to the scalable periphery amplifier, wherein the circuital arrangement is configured to select during operation of the amplifier a mode of operation of the scalable periphery amplifier between a non-test mode and a test mode of operation, the circuital arrangement comprising:
a controller unit comprising an interface circuit to connect to an external test equipment, wherein the controller unit is configured to:
detect connection of an external test equipment to the interface circuit, and
control a configuration of the scalable periphery amplifier during operation in the test mode.

25. The amplifier of claim 23, wherein the controller unit is further configured during operation of the amplifier to automatically select the test mode of operation when connection to an external test equipment is detected.

26. The amplifier of claim 24, wherein the controller unit is further configured during operation of the amplifier to automatically select the test mode of operation when connection to an external test equipment is detected.

27. A testing system for testing operation of the amplifier of any one of claims 23-26, wherein the testing system comprises a controller circuital arrangement configured during testing of the amplifier to couple to the interface circuit of the amplifier such as to cause detection of the testing system by the controller unit of the amplifier.

28. The testing system of claim 27, wherein the controller circuital arrangement is further configured during testing of the amplifier to select the mode of operation of the scalable periphery amplifier.

29. The testing system of claim 28, wherein the controller circuital arrangement is further configured during testing of the amplifier to activate and/or deactivate the one or more amplifier segments such as to control an output impedance of the scalable periphery amplifier.

* * * * *